United States Patent
Biebuyck et al.

(12)

(10) Patent No.: US 6,326,058 B1
(45) Date of Patent: Dec. 4, 2001

(54) DEVICE FOR PATTERNING A SUBSTRATE WITH PATTERNING CAVITIES

(75) Inventors: Hans Biebuyck, Adliswil; Emmanuel Delamarche, Zurich; Michel Bruno, Adliswil; Heinz Schmid, Oberrieden, all of (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/528,326

(22) Filed: Mar. 20, 2000

Related U.S. Application Data (62) Division of application No. 08/997,900, filed on Dec. 24, 1997, now Pat. No. 6,089,853.

(51) Int. Cl.[7] .................................. B05D 1/36; B05D 5/12
(52) U.S. Cl. ........................... 427/261; 427/96; 427/265; 427/286
(58) Field of Search .............................. 427/96, 261, 264, 427/265, 275, 286; 101/170, 493

(56) References Cited

U.S. PATENT DOCUMENTS 2,656,570 * 10/1953 Harmon et al. .

FOREIGN PATENT DOCUMENTS 50-22072 * 7/1975 (JP) .

OTHER PUBLICATIONS

A. Kumar, H. Biebuyck and G. M. Whitesides "Patterning SAMs : Applications in Materials Science", Langmuir 10, 1498 (1994).

H. Biebuyck, N. B. Larsen, E. Delamarche and B. Michel in "Lithography Beyond Light", IBM Journal of Research and Development 41, 159–170 (1997).

Y. Chou, P.R. Crauss and P.J. Renstrom "Imprint of Sub–25 nm Vias and Trenches in Polymers", Appl. Phys. Lett. 67, 3114–3116 (1995).

E. Kim, Y. Xia and G.M. Whitesides "Polymer Microstructures Formed by Moldin;g in Capillaries", Nature, 376, 581–583 (1995).

E. Delamarche, A. Bernard, H. Schmid, B. Michel and H. Biebuyck "Patterned Delivery of Immunoglobins to Surfaces Using Microfluidic Networks", Science 779–781 (1997).

* cited by examiner

*Primary Examiner*—Fred J. Parker
(74) *Attorney, Agent, or Firm*—Robert M. Trepp (57) ABSTRACT

A patterning device comprises a patterning cavity which has an opening located at the surface of the patterning device within a transfer region, where a substrate during patterning comes into conformal contact with the patterning device. A service cavity is located in a service region of the patterning device and is connected to the patterning cavity, such that a patterning fluid is able to flow from the service cavity to the patterning cavity. A patterning method uses this device.

4 Claims, 5 Drawing Sheets

DEVICE FOR PATTERNING A SUBSTRATE WITH PATTERNING CAVITIES

This is a division of application Ser. No. 08/997,900, filed Dec. 24, 1997, now U.S. Pat. No. 6,089,053.

FIELD OF THE INVENTION

The present invention is directed towards patterning of a substrate. It aims in particular at, but is not restricted to, the creation of microscopically small patterns of the type used in micro-electronics e.g. semiconductor chips and microtechnology. More specifically, the invention relates to the patterning of a substrate by using a patterning device, the pattern being materialized in the form of openings in a transfer region of the patterning device surface.

The invention relates also to the modification of the contacted substrate surface under the influence of fluids filled into or rinsed through the cavity.

The invention relates also to the controlled deposition of one or different types of chemically defined bodies on predetermined areas of the contacted substrate surface.

The term "conformal contact" implies that the surface shapes of two media put on top of each other are similar to such an extent that fluids can essentially not penetrate into the plane where the surfaces meet each other. The term "fluid" refers to both liquids and gases. The fluid may consist of several components such as a solution and of more than one phase such as an emulsion or a suspension (slurry) of bodies in a carrier fluid.

With regard to the potential applications of the invention, the structuring of materials used in microelectronics, in particular silicon wafers, is of central importance. Here, it may be possible to replace certain lithographic processing steps by the patterning with a patterning device. In biotechnology, the controlled deposition of chemically defined bodies (CDBs) may greatly profit from the present invention. As a CDB shall be understood as any object which consists of one or more molecules whose chemical composition is at least partially known at the external region of the body such that a preferential orientation is chemically determinable. In particular, such CDBs may be ligands or receptors which are chemically attractive to specific complementary receptors or ligands like keys that fit into specific locks. In case of such single-molecular particles, the distinction between solution and suspension becomes meaningless.

The fluids can react with the contacted substrate surface in various ways, resulting in dissolution or chemical modification of substrate material, or in precipitation of a new material. The resulting structures are restricted to the exposed areas of the contacted substrate surface, hence replicate the original pattern. After separation from the patterning device, the substrates can be further processed, e.g. by lithographic methods, using deposited layers as masks, or be employed as secondary stamps.

BACKGROUND OF THE INVENTION

The structuring of surfaces according to predetermined patterns is an elementary step in any device-manufacturing process. Precision, speed and cost of the structuring processes frequently are decisive factors for success or failure of a product. The development of microelectronics, microbiology, and microtechnology in general raised these needs enormously, generating ever increasing requirements for smaller structures, larger scale integration, and lower cost.

The classical patterning techniques used in microtechnology are photo- and electron beam lithography. Photolithography is a fast, efficient parallel process. Its principal problem is the diffraction limit which restricts the minimum structural dimensions to about one half to one quarter of the light wavelength. To cope with the shrinking dimensions of microtechnical structures, imaging systems for shorter and shorter wavelengths were developed in recent years. Due to a number of basic limitations, the ultimate limits of conventional optical lithography will be of the order of 100 nm. These dimensions will be reached soon. Near-field optical lithography is not bound to the diffraction limit and therefore suitable for the generation of even smaller structures. This method however, still is in a very early state; its potential for industrial application cannot be estimated yet.

Electron beam lithography is the present day's preferred solution for the generation of structures with very small dimensions. As a serial, direct writing process, however, it becomes slower and slower with increasing complexity of the patterns to be transferred. For this reason, electron beam lithography has been used mainly in mask fabrication so far and not in the mass production of semiconductor chips. Ion beam lithography operates on similar principles as electron beam lithography but is far less established because of ion implantation and other disadvantageous effects.

A basic feature of optical and electron lithography is the use of an overlay, typically an organic polymer, that serves as the base for pattern formation on an underlying substrate. The overlay is formed on the substrate by homogenous deposition. Evaporation or spin-coating from an organic solvent provides a continuous film on the substrate. Exposure of the overlay to radiation (optical, electron or ion) causes localized changes in its chemistry permitting differential dissolution of the overlay and opening up windows in the film onto the underlying substrate. Patterning can then be affected by wet chemical or dry etching processes where the presence of the overlay provides a local, externally controlled physical mask to chemical reaction. Alternatively, material can be deposited onto the substrate through the windows in the overlay by various methods such as evaporation, chemical vapor or sputter deposition, or galvanic techniques.

These methods of pattern formation are tremendously useful; nevertheless they have certain shortcomings: Several steps are required before pattern transfer is complete; dissolution of the overlay requires a development step that exposes the whole system to organic solvents, plasmas or otherwise chemically harsh conditions. Here, bulk quantities of chemicals are consumed even though only quite localized chemical reactions are needed, steps that are generally wasteful of the reagents. The use of physical masks means that when material is deposited through the mask much of it will be unproductively directed onto the tops of the physical mask. Afterwards, where elimination of the externally controlled physical mask is needed, the conditions for this removal can be injurious to the newly formed substrate, especially where fragile organic materials have been deposited. Furthermore, the masking layer provided by the overlay is not reusable so that specialized equipment is required to form a new pattern on an existing or subsequent substrate. Finally, irradiation used to form the pattern can damage the underlying substrate by the introduction of chemical or electronic disturbances in the region near the overlay.

In view of the increasing gap between the needs of industry and the existence of foreseeable limitations of the established techniques, the development of alternatives is highly desirable. Stamping techniques, including embossing and gravure (intaglio printing) are promising candidates in this context. Ignored for many years in micro-technology, they recently began to attract renewed attention: It was demonstrated that structures with very small dimensions, in some cases of less than 100 nm in size, can be replicated by means of stamping techniques as described, with regard to the use of self-assembled monolayers e.g. in the article by A. Kumar, H. Biebuyck and G. M. Whitesides "Patterning SAMs: Applications in Materials Science", Langmuir 10, 1498 (1994) or by H. Biebuyck, N. B. Larsen, E. Delamarche and B. Michel in "Lithography Beyond Light", IBM Journal of Research and Development 41, 159–170 (1997), with regard to embossing e.g. by Y. Chou, P.R. Krauss and P.J. Renstrom "Imprint of Sub-25 nm Vias and Trenches in Polymers", Appl. Phys. Lett. 67, 3114–3116 (1995), and with regard to intaglio techniques e.g. by E. Kim, Y. Xia and G. M. Whitesides "Polymer Microstructures Formed by Molding in Capillaries", Nature, 376, 581–583 (1995) and by E. Delamarche, A. Bernard, H. Schmid, B. Michel and H. Biebuyck "Patterned Delivery of Immunoglobins to Surfaces Using Microfluidic Networks", Science 779–781 (1997). Intaglio techniques, commonly known from gravure, exploit capillary attachment of inks to the cavities of a patterning at the surface of a patterning device. When pressed against the inked patterning device, the paper penetrates the cavities slightly and draws out the ink.

In microtechnology, the substrate to be structured neither is porous nor flexible in general. Furthermore, the desired modification does not necessarily involve the deposition of an ink.

It is possible, however, to conceive pattern transfer devices and methods on the basis of intaglio printing techniques which are not restricted to those modes of operation and open interesting alternatives to the conventional lithography while avoiding some of the disadvantages mentioned before.

In the publication by S.P.A. Fodor et al. "Light-directed, spatially addressable parallel chemical synthesis", a method is described which combines solid-phase chemistry, photo-labile protecting groups and photolithography to yield a highly diverse set of chemical products. Binary masking yields $2^n$ compounds in n chemical steps. For each step, the test substrate has to be covered completely with material containing one of the n starting materials. The resulting consumption of starting materials can become considerable if the cost of these materials is high. The method was used successfully in accessing genetic information with high-density DNA arrays as described in the article with the same title by M. Chee et al. which appeared in Science, Vol. 274, 610–614 Oct. 25. 1996.

H. Biebuyck, E. Delamarche and B. Michel disclosed a method in International patent application PCT/IB96/00908 corresponding to U.S. Pat. 6,096,386 which issued Aug. 1, 2000 which allows controlled deposition of CDBs by means of a stamping technique and mediated by layers of complementary CDBs (C-CDBs). The CDBs and C-CDBs can be molecules, macromolecules and/or other nanostructures. The proposed method is applicable on (C-)CDBs whose chemical composition is at least partially known at the external region of the body which allows to deposit them with a chemically determinable orientation, as is the case with many molecules or macromolecules or materials or components derivatized on their surface to have a useful chemical asymmetry. Specifically, such (C-)CDBs may be organic molecules acting as ligands or receptors for the respective complementary molecules.

Specifically, Biebuyck et al. suggest to use a stamping means for simultaneous locally-separated deposition of different CDBs whose ridges are "inked" with different types of C-CDBs. The stamping means then is dipped into a fluid which contains the CDBs to which the C-CDBs are complementary. After selective attachment of the CDBS, the stamping means is removed from the fluid and brought in contact with a substrate. The surface of the substrate is covered with an attachment means which exerts strong adhesion on CDBS. The CDBs get attached and hence transferred to the substrate surface in areas predetermined by the pattern of the stamping means. By this procedure, the orientation of the CDBs is guaranteed and the arising functionality is maximised.

In the patent application by Biebuyck et al., the step of inking the stamping means with different C-CDBs, which is a non-trivial one, was left unattended. The present invention provides a simple solution to this problem and at the same time allows to generate in a single step patterns formed by different C-CDBs.

In the above-mentioned publication by E. Delamarche, A. Bernard, H. Schmid, B. Michel and H. Biebuyck "Patterned Delivery of Immunoglobins to Surfaces Using Microfluidic Networks", Science 779–781 (1997), the authors describe the formation of a network of conduits at the interface of a substrate in contact with a printing plate made from an elastomer. The active transfer region of the printing plate is structured into a patterning in such a way that capillaries are formed which can be filled through openings arranged outside the transfer region. The capillaries can direct spatially chemical reactions between the surface of the substrate and ligands introduced by flow of aqueous, buffered solutions through the network, immobilizing ligands, —like drugs, enzymes and immunoglobins—all along the conduits by their covalent attachment to the activated substrate. Release of the elastomer reveals a uniform and functional layer of the ligands in the image of the pattern molded in the elastomer. Subsequent exposure of this substrate to a homogeneous or heterogeneous solution of receptors allows specific recognition and attachment of the receptors to the immobilized ligands with high resolution (sub-micron) and specificity.

SUMMARY OF THE INVENTION

A patterning device is proposed which has a transfer region which comprises a patterning structure which may consist of a plurality of patterning cavities. The patterning cavities may be connected to each other and to link cavities. Furthermore, a service cavity is part of the patterning device and is connected to at least one patterning cavity for supplying the patterning cavity with a fluid. The link cavities bridge the distances between separated patterning cavities or between a patterning cavity and a service cavity and may particularly serve for building conduits that comprise several connected cavities but are independent from each other. The service cavity lies mainly in a service region of the patterning device which is outside the transfer region.

The patterning cavities get closed due to the intimate contact with the substrate surface onto which a pattern is to be transferred. The cavities then become conduits which can be filled, rinsed, and/or emptied by fluid supply means attached to or integrated into the service region. Depending on the kind of fluid, the pattern can be created or transferred by dissolution or modification of the contacted substrate surface, or by precipitation of material from the fluid. Filling different conduits with different fluids simultaneously and/or the same conduits in sequence allows one to build complexly structured patterns on the contacted substrate surface.

Use of such a patterned substrate as a secondary stamp enlarges the range of applications of this pattern transfer technique.

Also a patterning method is proposed which uses the patterning device. The device and method described are particularly suited for the transfer of microscopically small patterns of the type used in micro-electronics e.g. semiconductor fabrication and micro-technology.

In the present invention, a patterning device comprises a certain region, called transfer region, which comprises patterning cavities which may be connected by auxiliary link cavities. Additionally, service cavities are connected to the patterning cavities. When brought in contact with a substrate which is to be patterned, each cavity is closed to form a conduit which can be filled, rinsed, emptied, refilled etc. with one or more fluids without removal of the patterning device from the substrate. The transfer region of a patterning device may comprise many cavities which form a conduit when in contact with the substrate. The network may include conduits of microscopically small dimensions. This is a first object of the present invention.

A second object of the invention is a method for patterning with such a patterning device a contacted substrate surface. Reactions between the respective fluids filled into the network and the exposed areas of the contacted substrate surface can result in dissolution or modification of substrate material as well as deposition of material from the fluids on the substrate. The use of conduits with microscopically small dimensions allows generating patterned structures of the size required in microelectronics and microtechnology in general.

A third object of the invention is the extension of these techniques to more complex patterning schemes such as the use of an externally controlled physical influence, e.g. light, electric current, to initiate, sustain, stop, and/or suppress the reaction between the fluids and the substrate.

The invention according to the independent claim 1 has the property that a conduit, comprising a patterning cavity and a service cavity, is formed when conformal contact is made between the transfer region of the patterning device and the substrate. This has the advantage that the conduit can be filled with a fluid during contact. The surface of the patterning device can for this purpose be chosen to be flexible, e.g. by comprising an elastomeric material.

The invention implies a capability to manipulate fluids in the conduit and to influence the reactions between these fluids and the exposed areas of the contacted substrate surface.

A small opening and an increasing width below has the advantage that the flow resistance in the conduits can be kept low even if the openings of the patterning cavities are very narrow and/or the conduits are very long.

An embodiment with miniaturised patterning cavities, has the advantage that the pattern transfer process can supplement or even replace the lithographic patterning processes commonly used in the fabrication of microelectronic or micromechanic devices. It has the further advantage that very small quantities of fluids are used up by the patterning process, which can be of particular importance for biotechnological applications. The use of a miniaturised conduit allows to guide, for instance, nanoliter quantities of reagent to targeted areas. This can be used to immobilize ligands, a first step in many bioassays, on a substrate with sub micron control. Making patterns of ligands by chemical reactions within the conduits of the network has several practical benefits. It is simple, inexpensive and highly economic of reagents. It furthermore is compatible with many existing chemistries and substrates already employed for the attachment of macromolecules to surfaces, and its use does not preclude newer forms of covalent coupling requiring light activation since the printing plate and/or substrate may be made from material transparent well into the ultraviolet.

Using an elastomeric material, has the advantage that the transfer region of the patterning device can adapt to the shape of the contacted substrate surface by elastic deformation within large tolerances. The patterning device or at least part of it can be made, for instance, from an elastomer. This results in the advantage that the shape tolerance requirements can be relaxed. As a further advantage, appropriate elastomers are transparent to optical radiation far into the UV region of the spectrum, allowing for effective photoactivation and/or passivation of materials contained in the fluids in the conduit.

The cavity may be evacuated before filling or the medium occupying the cavities, for instance air, is driven out during filling by diffusion through the patterning device and/or substrate or through a second service cavity. The formation of a conduit has the advantage that the fluid is shielded from the influences of the environment while floating through the cavity. In this way, pollution or changes in concentration of the fluid due to evaporation can be avoided.

An embodiment with a good wettability in the conduit has the advantage that the fluid is pulled into the conduit under the influence of wetting forces. The importance of this effect increases with decreasing cross sections of the conduit. It therefore facilitates the filling of miniaturised conduits. Good wettability of the walls of the conduit in combination with poor wettability of the exterior surface of the transfer region has the further advantage that the patterning cavity remains quasi-closed for a fluid even if the contact between contacted substrate surface and transfer region of the patterning device is less than perfect. It is possible, for instance, to make the walls hydrophilic and the exterior surfaces hydrophobic. This makes it energetically favorable for an aqueous fluid to stay out of the small crevasses that might be left open between patterning device and the substrate to be patterned. As a result, the shape tolerance requirements for the transfer region of the patterning device respectively and the contacted substrate surface can be relaxed.

Arranging the transfer region in a recess on one hand is a good means for achieving an automatic adjustment or alignment of the substrate relatively to the patterning device and on the other hand brings a bigger flow resist to the fluid, when the fluid is able to penetrate into the gap between the substrate and the patterning device. Depending on the quality of the contact between the substrate and the patterning device it could be possible that the fluid to a certain extent flows into this gap and deposits some material on the substrate. One possible solution to remove such unwanted material could be a short removing process, such as etching, which due to a big difference in layer thickness does only insignificantly damage the pattern. This is however no solution for monolayer-forming reactions, where hence greatest care should be taken to avoid such gap penetration by a very conformal contact.

An embodiment with a transfer element and a bottom element has the advantage that the patterning device can be optimized according to different design criteria simultaneously. It is possible, for instance, to make the bottom element of the patterning device conductive and the transfer element insulating. It is also possible to use a stiff bottom element which defines the overall shape of the patterning device and to combine it with an elastomeric transfer element which provides shape adaptability. In still another possible application, a UV-light transparent bottom element may be employed, which allows for local photo-activation or passivation by an external UV light source.

An embodiment with one or more link cavities has the advantage that patterning cavities in separated parts of the transfer region can be connected to form single or branched strings of cavities each of which may begin and/or end in a single service cavity. This allows the transfer of complex patterns with a small number of service cavities. It is possible, for instance, to have some patterning cavities of a particular string be surrounded completely with patterning cavities from a different string. This is achieved by burying one or several link cavities in the depth of the patterning device.

A method according to the invention allows modification of the exposed areas of a contacted substrate surface by chemical reactions with the fluid filled into the cavities. The reaction may result in dissolution or chemical modification of the substrate material, or in deposition, physi or chemisorption and/or growth of layers of new materials on top of the substrate. This has the advantage that the contacted substrate surface can be patterned in the shape of depressions, chemically modified regions, and/or elevations made up of new materials. The new materials may differ from that of the substrate or may be the same.

A method using an attachment means has the advantage that, mediated by an attachment means, material precipitated from the fluids can be attached to the exposed areas of the contacted substrate surface even if the untreated substrate surface was repelling to the material. The attachment means furthermore may be chosen such that the adhesion is selective for certain materials, for instance certain classes of CDBs or C-CDBs. The attachment means thus can suppress the deposition of unwanted materials contained in the fluids; it also can be useful for purification of the fluids.

A method which uses the attachment means as orienting means has the advantage that all CDBs, respectively C-CDBs are deposited with a certain, predetermined orientation which maximizes their functionality.

A method which uses different fluids in different conduits has the advantage that differently structured patterns can be generated at the contacted substrate surface simultaneously. It is possible, for instance, that a first conduit is filled with a fluid from which material is precipitated, resulting in a first, elevated pattern, and another conduit is filled with a corrosive, resulting in second, recessed pattern on the contacted substrate surface.

In another application, different types of C-CDBs, in particular ligands or receptors may be deposited simultaneously on a contacted substrate surface. The substrate patterned in this way can be used as a test probe for the receptors and ligands, respectively, to which the C-CDBs are complementary. If the conduit of a first and a second patterning device consist of n parallel channels each which are oriented orthogonal to each other and if the two patterns are transferred sequentially to the substrate, then $n^2$ combinations of materials can be deposited. High-density DNA, protein or peptide arrays, useful for assaying, can be generated effectively in this way. Also patterns can be generated which are composed of several structures. It is possible, for instance, to deposit two layers on top of each other in the shape of the pattern by rinsing through the conduits two different fluids, one after the other, from which the two layers are precipitated, respectively. It is also possible to rinse a cleaning fluid in between in order to avoid mixing of the two precipitation generating fluids. Rinsing of two fluids in periodic alternation allows the generation of superlattice-type patterned layers by this method. In another application, the first fluid might be corrosive, producing a pattern of grooves which might be filled up with a different material by precipitation from the second fluid. The method can also be used for separation and purification of CDBs in a process of selective affinity chromatography as described in "Guide to protein purification", by Murray P. Deutscher, Academic Press, Vol. 182. This method is general and used extensively in the purification of small and large molecules known in the chemical and biochemical fields.

A method where the reaction of the fluid with the substrate may be enabled or suppressed by externally controlled physical influence, e.g. by electrochemical or photochemical effects is more universal, since additionally to the patterning scheme mechanically predetermined by the patterning cavity dimensions, the selective control provides a scheme which allows to vary the result. Thereby even a higher definition can be achieved, for instance when the control scheme represents the patterning scheme and is slightly shifted relatively to the patterning cavity. For the first example, an insulating transfer element and a conductive bottom element and substrate may be chosen. Application of voltage between bottom element and substrate allows convenient control of the electrochemical modification; it is even possible to transfer certain parts of the pattern selectively by appropriate division of the bottom element into mutually isolated electrodes. For the second example, the patterning device and/or substrate may be fabricated from a transparent material. A focused beam of light allows for photoactivation or passivation, for instance of CDBS and/or C-CDBs in predetermined sections of the exposed areas of the contacted substrate surface.

A method which uses the substrate as a secondary stamp allows the formation of a pattern on a target substrate in ways which cannot easily be achieved by a single step pattern transfer process. CDBS, for instance prefer to adhere to their complementary on a substrate through their reactive ends. If such a substrate is used as intermediate substrate, the CDBs can be transferred to a third substrate, serving as the target substrate, in the reverse, "backside up" orientation, where they can be fixed without interfering with the reactive end. This approach maximizes the amount of correctly oriented CDBs on the target substrate.

The method further is advantageous if the pattern transfer process requires the usage of aggressive chemicals respectively and chemically sensitive target substrates. In such a case, the intermediate substrate can be made from a material which is inert with respect to the aggressive chemical.

Besides microelectronics, biotechnology may profit in particular from advanced microstructuring techniques. Large numbers of different types of CDBs can be deposited at predetermined positions of a substrate with the help of the present invention. For instance, immobilizing ligands on surfaces is a first step in many bioassays, a prerequisite in the design of bio-electronic devices, and valuable in certain combinatorial screening strategies. Existing methods typically expose macroscopic areas of a substrate to milliliter quantities of solution to affect attachment of one type of molecule, sometimes using light and specialized chemistries to carry out localized reactions.

The method is further advantageous in that it is highly conservative because the reagents can be recovered from the arrangement after having been used for patterning the substrate.

DESCRIPTION OF THE DRAWINGS

Examples of the invention are depicted in the drawings and described in detail below by way of example. It is shown in FIG. 1A shows a side view cut through a patterning device with empty cavities.

The figures are not shown in real dimensions for the sake of clarity, nor are the relations between the dimensions shown in a realistic scale.

DETAILED DESCRIPTION OF THE INVENTION

Out of the variety of opportunities for pattern transfer provided by the present invention, a number of exemplary embodiments and methods are described hereinafter.

Figure 1A:
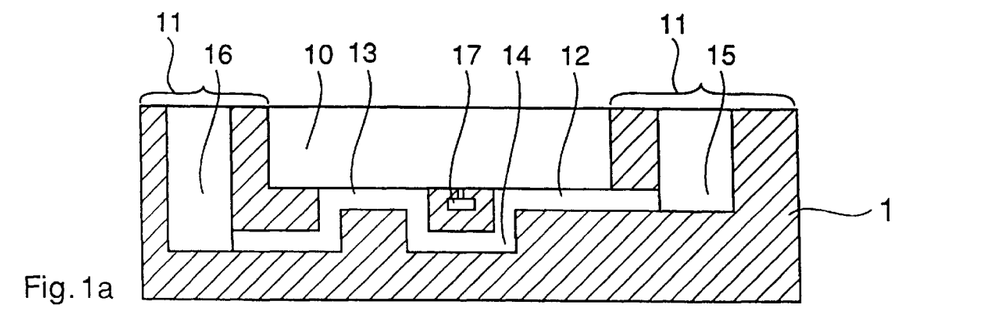
Figure 1B:
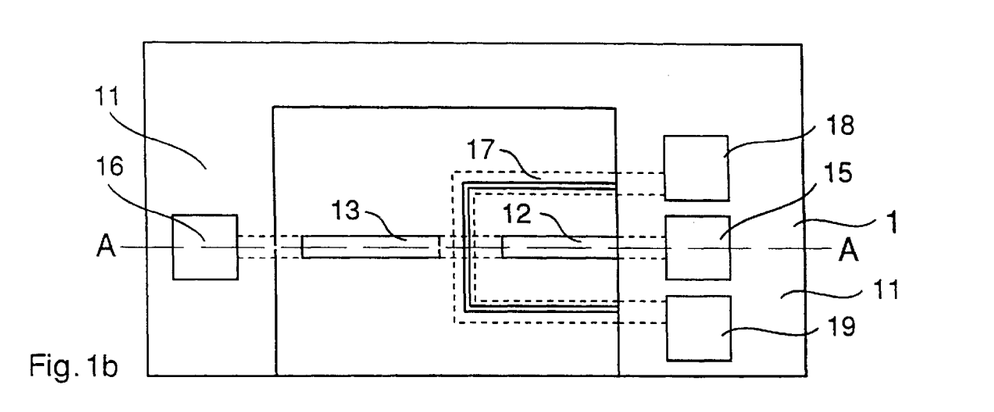
FIG. 1B shows a top view of the same patterning device.

FIGS. 1A and 1B schematically show a patterning device, which is also called printing plate 1, in a sidecut-view and a top view, respectively. At the top surface of the printing plate 1, a transfer region 10 and a service region 11 can be distinguished. A first patterning cavity 12, a second patterning cavity 13, a link cavity 14, a first service cavity 15 and a second service cavity 16 together form a first string of cavities 12, 13, 14, 15, and 16. The two patterning cavities 12 and 13 lie essentially in the transfer region 10 and are connected via the link cavity 14. The first and second service cavity 15 and 16 respectively connect the first and second patterning cavity 12, 13 with openings in the service region 11.

A U-shaped patterning cavity 17, a third service cavity 18 and a fourth service cavity 19 together form a second string of cavities 17, 18, and 19. The U-shaped patterning cavity 17 lies mainly in the transfer region 10. The third and fourth service cavity 18 and 19 respectively connect the U-shaped patterning cavity 17 with openings in the service region 11. The width at the opening of the U-shaped patterning cavity 17 is narrower at the top than the width at its base. Hence, its cross-sectional area is increased compared to a cavity with straight side walls with the same width as the opening at the top.

The link cavity 14 is buried in the bulk of the printing plate 1 such that the U-shaped patterning cavity 17 is bridged and that the two strings of cavities remain isolated from each other.

The openings of the patterning cavities 12, 13, and 17 represent a pattern to be transferred and are all arranged in the transfer region 10.

Figure 1C:
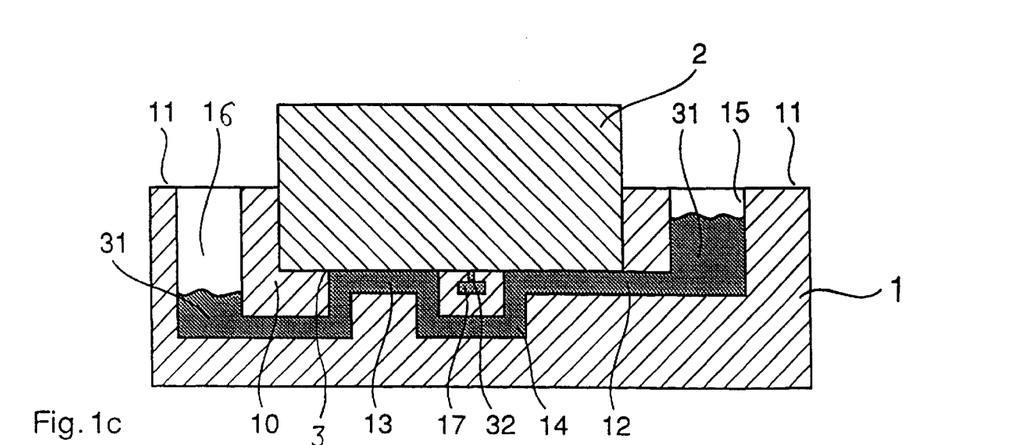
FIG. 1C shows a side view cut through the same patterning device in contact with a substrate, the cavities being filled with fluids.

FIG. 1C schematically illustrates a state during a first step of a pattern transfer process: A substrate 2 is brought into conformal contact with the transfer region 10 of the printing plate 1. The substrate 2 closes the openings of the two strings of cavities such that the first string of cavity becomes a first conduit and the second string of cavities becomes a second conduit.

A first fluid 31 is filled into the first service cavity 15 and flows under the influence of gravity and capillary forces through the connected patterning cavities 12 and 13 and the link cavity 14 to the second service cavity 16. The continuous flow has the advantage to improve the homogeneity of the fluid composition within the first conduit as well as during the course of the following reaction with the substrate 2. A second fluid 32 is filled correspondingly into the third service cavity 18 and flows through the U-shaped patterning cavity 17 to the fourth service cavity 19.

Surface 3 of the substrate 2 is hereby brought into contact with the fluids 31 and 32 at the positions of the patterning cavities 12, 13, and 17. Hence the fluids 31 and 32 can thereby interact with surface 3 of substrate 2. The interaction can be of various kinds. Material deposition as well as material removal can take place.

Figure 2:
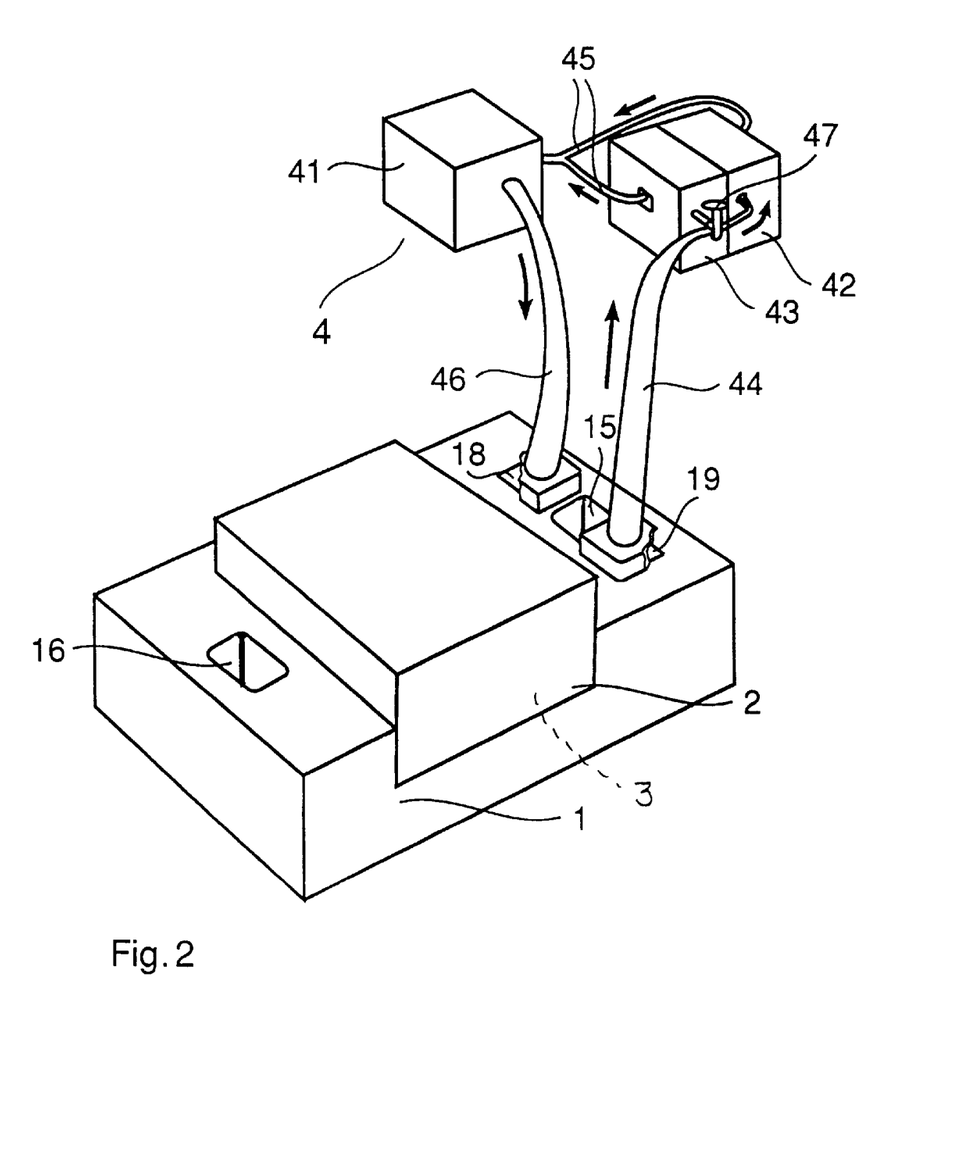
FIG. 2 shows a view in perspective of the same patterning device in contact with a substrate, the patterning device being connected to a fluid supply means.

FIG. 2 schematically shows an arrangement which is particularly suited for rinsing larger quantities of the different fluids 31 and 32 subsequently e.g. through the second conduit. The two service cavities 18 and 19 are connected to a fluid supply means 4 consisting of a pump 41, connecting tubes 44, 45, 46 and two reservoirs 42 and 43 filled with the fluids 31 and 32, respectively. A manually or otherwise operable cock 47 provides the possibility to pump the fluids 31 and 32 from the reservoirs 42 and 43 in alternation through the connected cavities 17, 18, and 19.

This arrangement allows performance of a series of processing steps at the contacted substrate surface. It is possible, e.g., to deposit alternating layers of two different materials, forming a superlattice on surface 3 without removal of the printing plate 1 from the substrate 2. One also might use an etchant as the first fluid 31 and first etch a groove into the contacted substrate surface 3 and then refill it in a second step with a different material, represented by the second fluid 32. In this example, the fluid supply means 4 is external. It also is possible, as an alternative or even additionally, to integrate the fluid supply means 4 or part of it into the printing plate 1, for instance by employing micromechanic techniques for its fabrication. Also a cleaning or neutralizing fluid can be used as one of the fluids 31 and 32. The number of fluids which can be used is generally not restricted, but can be any suitable number. Hence, various subsequent process steps can be performed without removing substrate 2 from printing plate 1, such that the precision on surface 3 of the achieved substrate modification remains constant. In the same way, the number of independent conduits is not limited and can be chosen according to the desired pattern.

FIGS. 3A–3G show different states in a process of surface modification which is possible with the arrangements depicted in FIGS. 1A, 1A, 1C and 2. The conduits are represented in the cross-sectional view exemplarily by the two separated patterning cavities 12, 17, located in the transfer region 10 of the printing plate 1. Their openings are sealed hermetically by surface 3 of substrate 2 which is in conformal contact with printing plate 1.

Figure 3A:
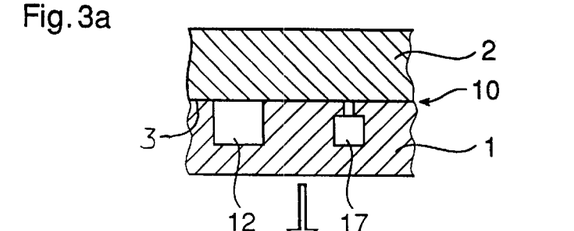
FIGS. 3A–G shows the states after different steps in the process of pattern transfer by reaction of fluids with the substrate surface.

FIG. 3A shows an arrangement, just after surface 3 of substrate 2 was placed on top of the printing plate 1. The patterning cavities 17, 12 are empty. The cross-section of the U-shaped patterning cavity 17 is larger at the base of the U-shaped patterning cavity 17 which is located far away from the surface in order to allow a more effective fluid transport in spite of the smaller opening located directly near the substrate surface. The cross-section of the first patterning cavity 12 is a rectangle since the opening of this cavity 12 is in this example sufficiently wide.

Figure 3B:
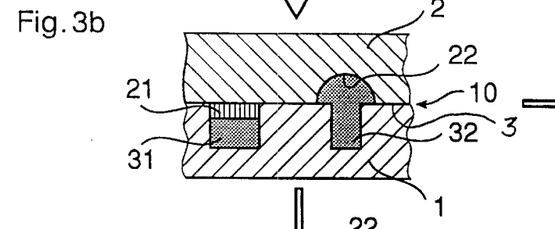

FIG. 3B shows the effect of rinsing the two different fluids 31 and 32 through the patterning cavities 12 and 17. The first fluid 31 is chosen to contain material that is to be deposited on surface 3 of substrate 2. Hence, a layer 21 of a material begins to precipitate and adheres in the area of the contacted substrate surface 3 exposed to the first fluid 31, forming layer or elevation 21. The second fluid 32 is an etchant. Hence, a depression 22 is being formed or etched into surface 3 where the area is exposed to second fluid 32.

Figure 3C:
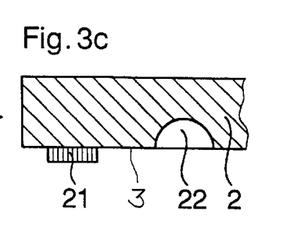

FIG. 3C shows the resulting pattern on the contacted substrate surface 3 if the patterning process is terminated at this stage and the substrate 2 is separated from printing plate 1. The pattern consists of layer or elevation 21 and depression 22.

Figure 3D:
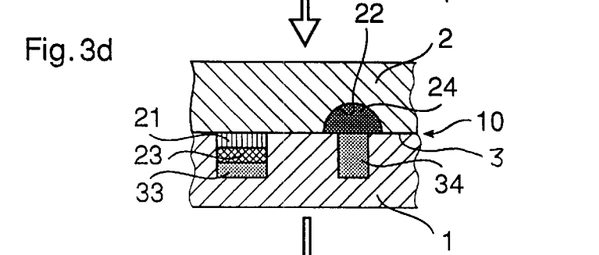

FIG. 3D shows, as an alternative, a possible second processing step: The fluids 31, 32 are subsequently replaced by another couple of fluids 33, 34 out of which a first deposited element 23 and a second deposited element 24 are precipitating onto the contacted substrate surface 3. The figure depicts a situation where the second deposited element 24 has just refilled depression 22.

Figure 3E:
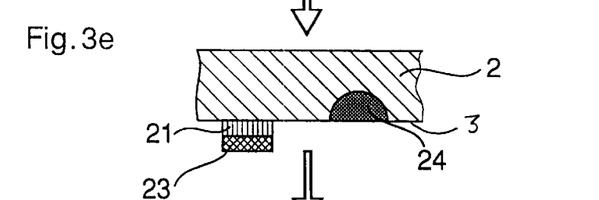

FIG. 3E shows the resulting pattern on surface 3 of substrate 2 after removal of the printing plate 1.

Figure 3F:
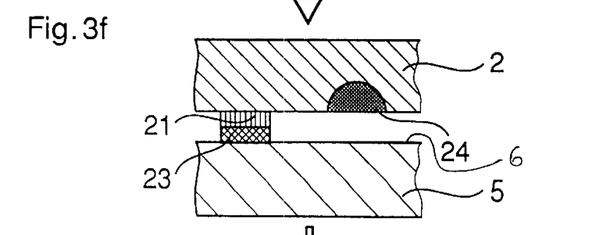

FIG. 3F shows how patterned substrate 2 may be used as a secondary pattern-transfer device. For this purpose, substrate 2 which here is used as an intermediate substrate is placed on top of a target substrate 5 such that conformal contact is made with the first deposited element 23.

Figure 3G:
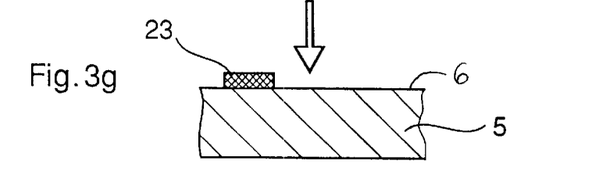

FIG. 3G shows the target substrate 5 after removal of the intermediate substrate 2. It is assumed here that the adhesive force between the first deposited element 23 and layer or elevation 21 is weaker than that between first deposited element 23 and surface 6 of target substrate 5. It also is assumed that the adhesive force between the first deposited element 23 and layer or elevation 21 does not exceed the cohesive forces within first deposited element 23. As a result, first deposited element 23 is transferred to target substrate 5 as a whole.

The described two-step pattern transfer process significantly widens the scope of feasible substrate modifications. It is possible, for instance, to employ as fluids 31 and 32 for the first steps (FIGS. 3B and 3C) fluid materials which are too reactive for a direct exposure to the target substrate 5. It further may be possible to achieve oriented precipitation of the constituents of the first deposited element 23 by an adequate choice of the material of layer or elevation 21. With appropriate precautions, the orientation may be maintained during the transfer to intermediate substrate 5 such that the constituents may get attached "backside up" to intermediate substrate 5.

Oriented deposition is also a topic described by H. Biebuyck, E. Delamarche and B. Michel in the International patent application PCT/IB96/00908. It occurs, for instance, with layers of self-assembling molecules. With the help of such a two-step process, the molecules could be made to adhere to a substrate surface in an orientation which would not be possible in a straight-forward self-assembly process.

Figure 4A:
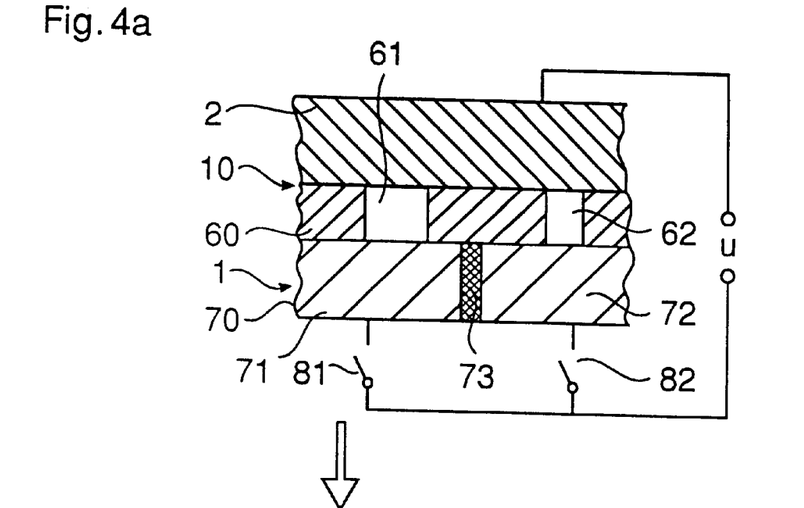
FIGS. 4A–C shows the states after different steps in the process of pattern transfer by a reaction of a fluid with the substrate surface induced by an externally controlled physical influence.
Figure 4B:
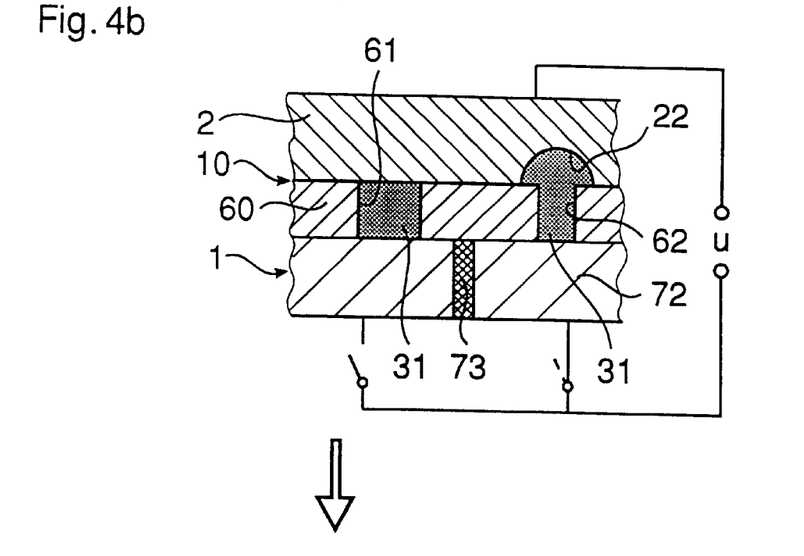
Figure 4C:
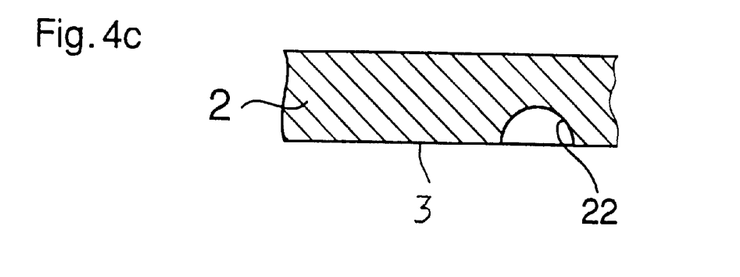

FIGS. 4A–4C illustrate how the pattern transfer can be controlled by an external physical influence which here is electrolytic dissolution by application of an electric field to selected cavities.

For this purpose, the printing plate 1 comprises an insulating transfer element 60 and an electrically conductive bottom element 70. Patterning cavities 61 and 62 are cut into the transfer region 10 of the printing plate 1 in such a way that transfer element 60 forms the side walls of the patterning cavities 61 and 62 and the bottom element 70 forms their common bottom. Bottom element 70 is composed of a first electrically conductive segment 71 and a second electrically conductive segment 72. An insulating layer 73 isolates them against each other. A voltage U can be applied to the different patterning cavities 61 and 62 individually by closing one or several switches 81 and 82. Substrate 2, assumed to be conductive, acts as a counterelectrode here.

FIG. 4A shows the arrangement, just after substrate 2 was placed on top of printing plate 1.

FIG. 4B shows the effect of applying a voltage between the second segment 72 and substrate 2 while first fluid 31 is rinsed through both patterning cavities 61 and 62. Due to electrolytic dissolution which only takes place where the electronic voltage U is present, the depression 22 is etched into the exposed area of the contacted substrate surface at the position juxtaposed to the patterning cavity 62. The substrate area juxtaposed to patterning cavity 61, however, remains unmodified. This example is to show that a substrate modification can be achieved by introducing control via a physical or chemical or, more generally environmental dependence. For instance, a magnetic, pressure, optical, catalytic, etc. control can be achieved by modifying the arrangement accordingly. Also, combinations of such control mechanisms can be used.

FIG. 4C shows the pattern resulting from this process, which consists of the depression 22 in substrate 2 in this case.

Figure 5A:
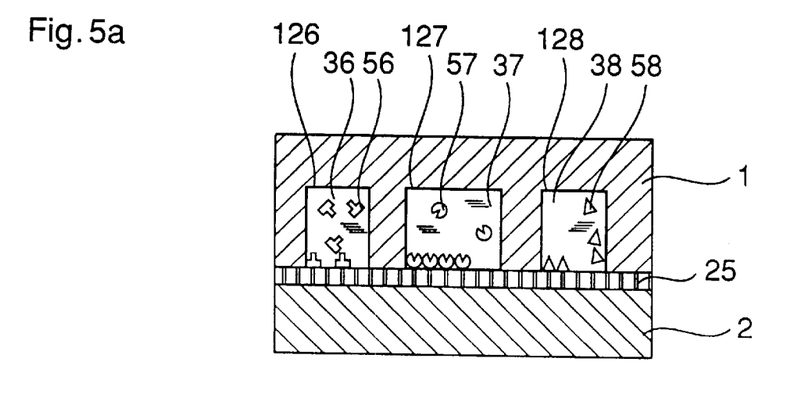
FIG. 5A shows a state in a process for manufacturing a test slide by the attachment of complementary chemically defined bodies (C-CDBs)
Figure 5B:
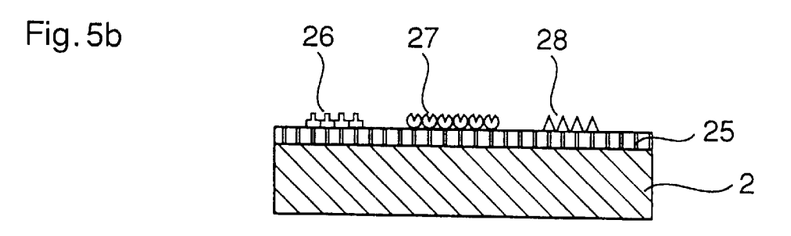
FIG. 5B shows a test slide with complementary chemically defined bodies (C-CDBs)
Figure 5C:
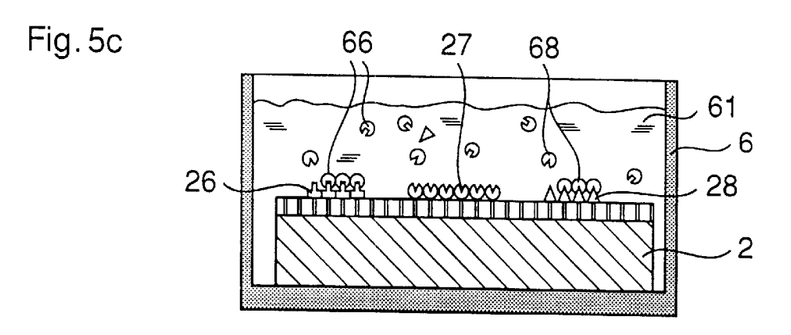
FIGS. 5C and 5D show the use of a test slide for the detection and/or accumulation of chemically defined bodies (CDBS) to which the C-CDBs are complementary.

FIGS. 5A–5C show a biotechnological application of the arrangements depicted in FIGS. 1A–1C and 2 and the method illustrated in FIGS. 3A–3G, namely the preparation and application of the substrate 2 as a test slide for chemically defined bodies. For this purpose, test slide 2 is coated with an attachment means which exerts an orienting effect on the respective complementary chemically defined bodies 56, 57, and 58 besides enhancing their adhesion.

FIG. 5A shows a state in a process of pattern formation while the printing plate 1 and substrate 2 are in conformal contact. The conduits are represented in cross-sectional view by three patterning cavities 126, 127, and 128 which belong to different conduits. The conduits are filled with different fluids 36, 37, and 38 which contain the complementary chemically defined bodies 56, 57, and 58, respectively.

FIG. 5B shows substrate 2 after removal from printing plate 1. Three separated complementary chemically defined body layers 26, 27, and 28 are deposited upon the attachment means 25, layers 26, 27, and 28 consist of complementary chemically defined bodies 56, 57, and 58, respectively.

FIG. 5C shows the use of substrate 2 as a test slide. Substrate 2 is immersed into a test fluid 61 in a container 6. Test fluid 61 is to be analyzed for the occurrence of chemically defined bodies 66, 67, and 68 which will adhere selectively to complementary chemically defined bodies 56, 57, and 58, i.e. the layers 26, 27, and 28, respectively. In the situation depicted in FIG. 5C, a few of the chemically defined bodies 66 and 68 have settled on top of layers 26 and 28 of complementary chemically defined bodies 56 and 58 already, but not on the middle layer 27 of complementary chemically defined bodies 57, since chemically defined bodies 57 therefor are missing in test fluid 61.

Figure 5D:
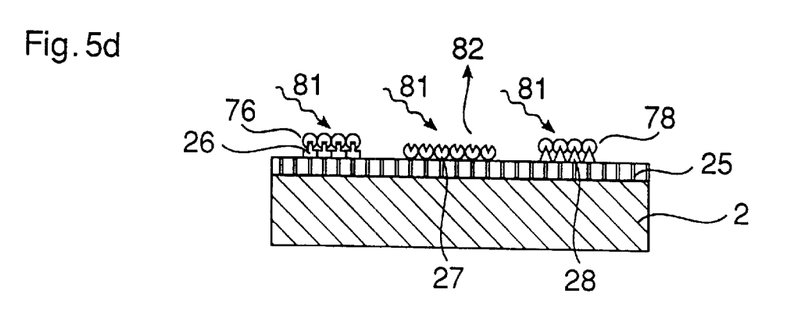

FIG. 5D shows the test slide 2 after removal from container 6 and test fluid 61. Chemically defined bodies 66 and 68 have formed monolayers 76 and 78 on top of layers 26 and 28 of complementary chemically defined bodies 56 and 58. Middle layer 27 of complementary chemically defined bodies 57 is uncovered, indicating that corresponding chemically defined body 67 was missing in test fluid 61. The presence of the layers 76 and 78 of the chemically defined bodies 76 and 78 can be readily tested, for instance by attaching fluorescent labels to complementary chemically defined bodies 56, 57, and 58 the fluorescence of which gets quenched by the adhering chemically defined bodies 76, 77, and 78. Thus, here, when illuminated with UV-light 81, only middle layer 27 shines up in fluorescence 82. Another possibility is the detection of fluorescence emanating from chemically defined bodies 76, 77, and 78. Any other test is as well applicable, such as testing for electrical, magnetic or any other physical or chemical property which is suited to distinguish or detect attached chemically defined bodies 76, 77, 78.

The characteristic patterning structures of the pattern are preferably of similar size as the structures used in microelectronics and microtechnology which in particular comprises structures with dimensions in the 100 nm to 100 micrometer range.

An embodiment with miniaturised patterning cavities, has the advantage that the pattern transfer process can supplement or even replace the lithographic patterning processes commonly used in the fabrication of microelectronic or micromechanic devices. It has the further advantage that very small quantities of fluids are used up by the patterning process, which can be of particular importance for biotechnological applications. The use of a miniaturised conduit allows to guide, for instance, nanoliter quantities of reagent to targeted areas. This can be used to immobilize ligands, a first step in many bioassays, on a substrate with sub micron control. Making patterns of ligands by chemical reactions within the conduits of the network has several practical benefits. It is simple, inexpensive and highly economic of reagents. It furthermore is compatible with many existing chemistries and substrates already employed for the attachment of macromolecules to surfaces, and its use does not preclude newer forms of covalent coupling requiring light activation since the printing plate and/or substrate may be made from material transparent well into the ultraviolet.

Using an elastomeric material, has the advantage that the transfer region of the patterning device can adapt to the shape of the contacted substrate surface by elastic deformation within large tolerances. The patterning device or at least part of it can be made, for instance, from an elastomer. This results in the advantage that the shape tolerance requirements can be relaxed. As a further advantage, appropriate elastomers are transparent to optical radiation far into the UV region of the spectrum, allowing for effective photoactivation and/or passivation of materials contained in the fluids in the conduit.

Different link cavities may cross each other or patterning or service cavities without getting into physical contact with them.

The flow direction within the conduits can be controlled also by additional means such as vessels. It is also possible to integrate small switching elements which perform a switching of the fluid flow.

Additionally, adjustment means or alignment means can be provided which ensure the correct position of substrate 2 with respect to transfer region 10. Such alignment can be a passive one, such as matching features, e.g. notches and protrusions but can also be performed by an active mechanism.

Having thus described our invention, what we claim as new and desire to secure by Letters Patent is:

1. Method for patterning a substrate comprising the steps of first making contact between a patterning device (1), which comprises at least one patterning cavity (12, 13, 17, 126, 127, 128) having an opening located at the surface of said patterning device within a transfer region (10), further having at least one service cavity (15, 16, 18, 19) located in a service region (11) and connected to said patterning cavity (12, 13, 17, 126, 127, 128), such that a fluid (31, 32) is able to flow from said service cavity (15, 16, 18, 19) to said patterning cavity (12, 13, 17, 126, 127, 128) and said substrate (2) in said transfer region (10) whereby said patterning cavity (12, 13, 17, 61, 62, 126–128) is covered by said substrate (2), thus forming at least one conduit, and second filling at least one fluid (31, 32, 36, 37, 38) into said service cavity (15, 18) and then allowing or forcing said fluid to flow from said service cavity (15, 18) to said patterning cavity such that said fluid (31, 32, 36, 37, 38) comes in contact with said substrate (2) at said patterning cavity (12, 13, 17, 61, 62, 126–128) and third separating said patterning device (1) and said substrate (2) from each other, and wherein before said first step, said substrate is at least partly coated with an attachment means (25) which enhances an adhesion force between said substrate (2) and a material in said fluid to be deposited and in said second step, selecting said fluid (31, 32, 36, 37, 38) containing said material.

2. Method for patterning a substrate according to claim 1, wherein said selected material includes one or more types of complementary chemically defined bodies (56, 57, 58) which are deposited on the contacted substrate (2) surface, said attachment means (25) exerting an orienting effect on said chemically defined bodies (56, 57, 58), such that at least one oriented layer (26, 27, 28) of said chemically defined bodies (56, 57, 58) is deposited.

3. Method for patterning a substrate according to claim 2 wherein during said second step at least one conduit is filled and/or rinsed with different fluids (31, 32, 36, 37, 38) sequentially and/or in parallel.

4. Method for patterning a substrate comprising the steps of first making contact between a patterning device (1), which comprises at least one patterning cavity (12, 13, 17, 126, 127, 128) having an opening located at the surface of said patterning device within a transfer region (10), further having at least one service cavity (15, 16, 18, 19) located in a service region (11) and connected to said patterning cavity (12, 13, 17, 126, 127, 128), such that a fluid (31, 32) is able to flow from said service cavity (15, 16, 18, 19) to said patterning cavity (12, 13, 17, 126, 127, 128) and said substrate (2) in said transfer region (10) whereby said patterning cavity (12, 13, 17, 61, 62, 126–128) is covered by said substrate (2), thus forming at least one conduit, and second filling at least one fluid (31, 32, 36, 37, 38) into said service cavity (15, 18) and then allowing or forcing said fluid to flow from said service cavity (15, 18) to said patterning cavity such that said fluid (31, 32, 36, 37, 38) comes in contact with said substrate (2) at said patterning cavity (12, 13, 17, 61, 62, 126–128) and third separating said patterning device (1) and said substrate (2) from each other, and wherein during said second step at least one conduit is filled and/or rinsed with different fluids (31, 32, 36, 37, 38) sequentially and/or in parallel.

* * * * *